(12) United States Patent
Liu et al.

(10) Patent No.: US 6,406,209 B1
(45) Date of Patent: Jun. 18, 2002

(54) UPPER LID ALIGNMENT APPARATUS FOR HATCHBACK REACTION CABIN

(75) Inventors: Chin-Kun Liu, Chu Pei; Pang-Cheng Liu; Tzu-Hsin Huang, both of Hsichu; Bruse Lee, PingTung, all of (TW)

(73) Assignee: Mosel Vitelic Inc., Hsinchu (TW)

( * ) Notice: Subject to any disclaimer, the term of this patent is extended or adjusted under 35 U.S.C. 154(b) by 1 days.

(21) Appl. No.: 09/620,566

(22) Filed: Jul. 20, 2000

(30) Foreign Application Priority Data

Mar. 24, 2000 (TW) ...................................... 89204804 U

(51) Int. Cl.⁷ ................................................ F16B 21/00
(52) U.S. Cl. ............................. 403/13; 403/14; 403/334
(58) Field of Search .............................. 403/12, 13, 14, 403/24, 25, 333, 334, 375

(56) References Cited

U.S. PATENT DOCUMENTS

| | | | | |
|---|---|---|---|---|
| 4,070,120 A | * | 1/1978 | Bald et al. ..................... | 403/13 |
| 5,112,154 A | * | 5/1992 | Milam .......................... | 403/13 |
| 5,253,944 A | * | 10/1993 | Preston ......................... | 403/13 |
| 5,678,944 A | * | 10/1997 | Slocum et al. ................. | 403/13 |

* cited by examiner

*Primary Examiner*—Lynne H. Browne
*Assistant Examiner*—John R. Cottingham
(74) *Attorney, Agent, or Firm*—Bacon & Thomas

(57) ABSTRACT

An upper lid alignment apparatus for hatchback reaction cabin includes at least three sets of mating members. Each mating member has a protruding active member located on a side wall of an upper lid and a receiving member located on a side wall of a table. The receiving member has a guide slope to guide the active member to slide and reset on an anchor spot on the receiving member. The upper lid hence may make closed contact with the table to form a sealed cabin for reaction process.

13 Claims, 4 Drawing Sheets

UPPER LID ALIGNMENT APPARATUS FOR HATCHBACK REACTION CABIN

FIELD OF THE INVENTION

This invention relates to an upper lid alignment apparatus for hatchback reaction cabin and particularly to an auxiliary alignment apparatus to facilitate accurate alignment of an upper lid on a table of the reaction cabin.

BACKGROUND OF THE INVENTION

In semiconductor manufacturing industry and other precision production industries, there is a need to use small size cabin or chamber to perform some special process or to produce goods in a small batch. The cabin being used usually has a table and an upper lid to form a sealed compartment inside. The upper lid may be removable or a hatchback type which may be partly lifted. Hatchback upper lid may be operated easily with mechanical arm and free a lot of human intervention, hence has been widely used.

FIG. 1 shows a conventional reaction cabin equipped with a hatchback upper lid. The cabin has a table 1 and a upper lid 5 (shown by broken line) to form a reaction chamber inside. A mechanical arm 3 is used to lift and open the upper lid 5. The mechanical arm 3 has a pair of beams 35 fastened to the upper lid 5 at one end. Another ends of the beams 35 are pivotally engaged with a shaft 37. Each beam 35 further attaches a lever which is pivotally engaged with a hydraulic cylinder 31. When the hydraulic cylinder 31 is activated, the beams 35 may be turned about the shaft 37 to lift the upper lid 5 from the table 1 or to close the upper lid 5 upon the table 1. Once the upper lid 5 is lifted and the cabin is opened, material charge, discharge, or maintenance work may be performed inside the cabin.

For closing the upper lid 5, there is a bordering plank 11 located in a side wall of the table 1 to guide and align the upper lid 5 fit on the table 1 accurately without drifting sideward.

For cabin maintenance, the upper lid 5 rectification is an essential step. To do the rectification, the upper lid 5 should firstly be laid and covered on the table 1. Then at least two rectification pins 13 shall be used to pass through the through holes 51 formed in the upper lid 5 and be inserted into rectification bores 15 formed in the table 1. If the rectification pins 13 cannot fit into the rectification bores 15, it means the alignment of the upper lid 5 and the table 1 is not correct. Then a minor adjustment must be made on the fastening of the upper lid 5 and the beams 35. When the minor adjustment set forth above cannot fix it, the adjustment screw 39 for the shaft 37 should be unwound and to move the shaft 37 to a new position so that the upper lid 5 has correct alignment with the table 1 until all the rectification pins 13 may fit into the rectification bores 15, then the adjustment screw 39 will be tighten to fix the shaft 37 the new-position. It is a tedious and time consuming process. For instance, to do this in an Endura® PVD system, it could take thirty minutes. It greatly impacts production process and efficiency. Furthermore, the constant opening and closing of the upper lid 5 during production process makes the alignment requirement happen frequently. It has ill effect on productivity and production yield.

SUMMARY OF THE INVENTION

It is an object this invention to provide an upper lid alignment apparatus for hatchback reaction cabin that can promptly and accurately align the upper lid with the table of the cabin so that wearing and misallocation of the upper lid against the table may be reduced, and productivity and quality of the goods processed in the cabin may be enhanced. For instance, electroplating of film using the Endura® PVD workstation may have higher quality.

The apparatus according to this invention includes at least three sets of mating means which use triangle geometric relationship to define and facilitate plane alignment between the upper lid and the table of a reaction cabin. Each mating means has an active member located on the upper lid mating and engaging with a receiving member located on the table. The receiving member has a guide slope and an anchor spot to easily nudge the active member resting on a desirable location so that the upper lid may have required alignment with the table.

In one aspect, the active member has a protrudent bar, stub and the like on a side wall of the upper lid. The receiving member may have a crutch receiving notch with two slant edges as the guide slope and a bottom recess as the anchor spot.

In another aspect, the active member may be located on the table and the receiving member may be located on the upper lid.

This invention aims at making the upper lid and the table to have a closed contact on a plane. As it takes at least three points to define a plane, it is preferably to have at least three sets of this invention in a given cabin. However some type of cabin already have upper lid alignment feature similar to this invention, in such an occasion, the number of those feature may be made complementary to this invention and be counted into the number of three set forth above.

BRIEF DESCRIPTION OF THE DRAWINGS

The invention, as well as its many advantages, may be further understood by the following detailed description and drawings, in which.

DETAILED DESCRIPTION OF THE PREFERRED EMBODIMENT

Figure 1:
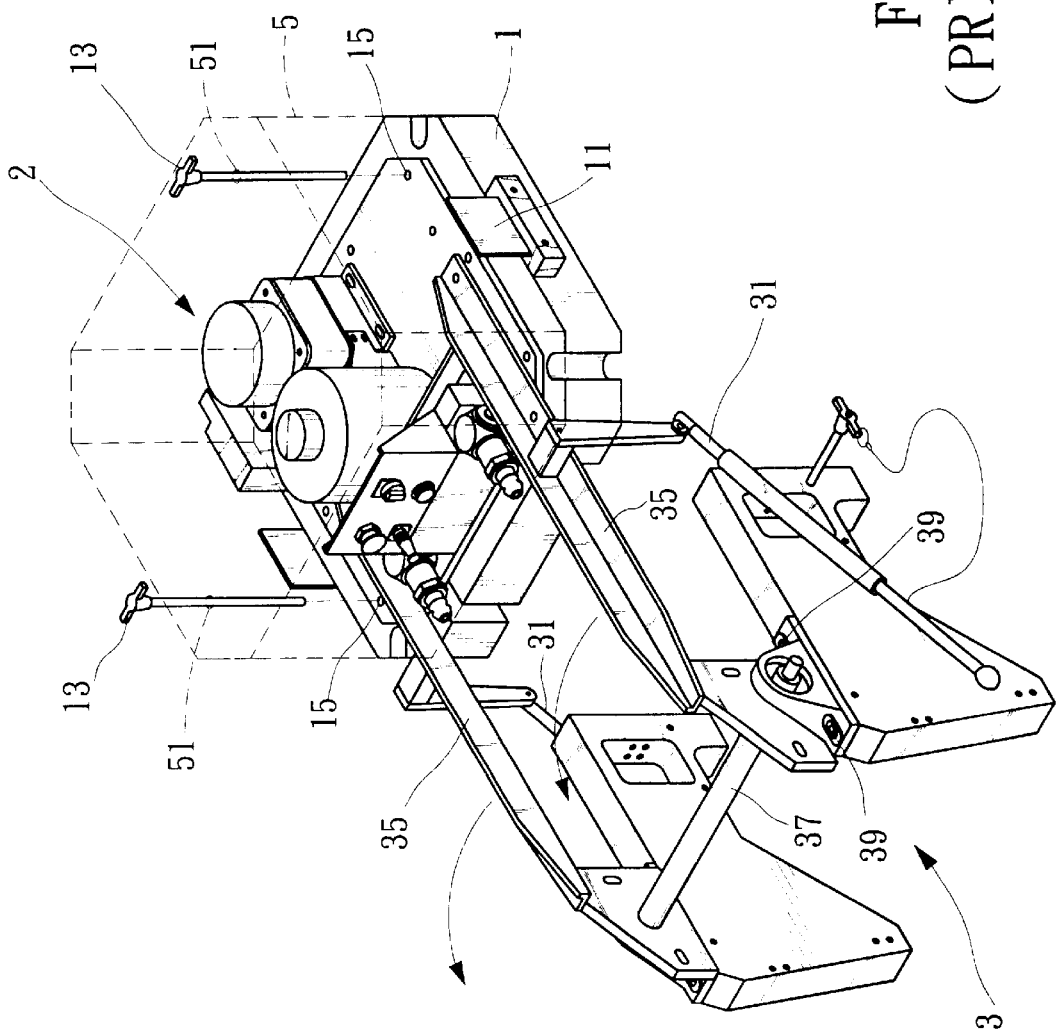
FIG. 1 a perspective view of a conventional hatchback reaction cabin, with an upper lid shown by broken lines.
Figure 2:
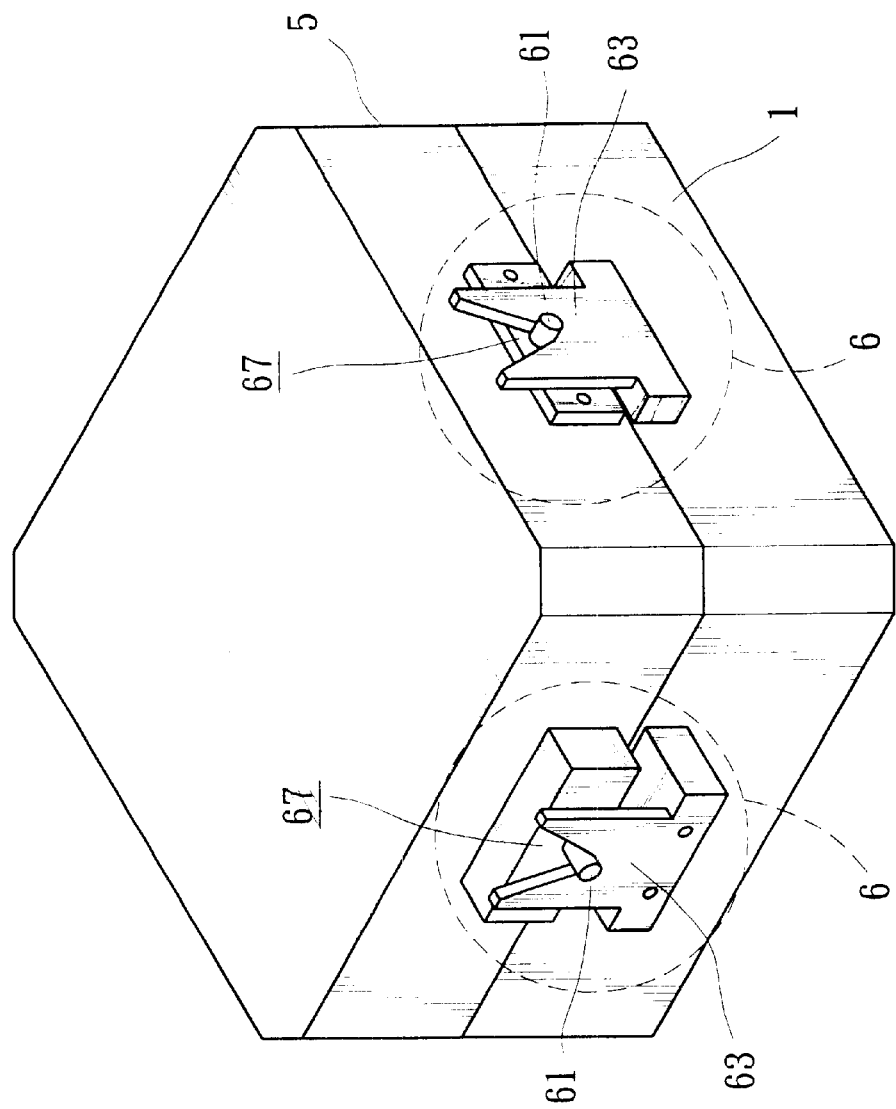
FIG. 2 is a perspective view of an embodiment of this invention.

Referring to FIG. 2, the upper lid alignment apparatus of this invention includes at least three sets of mating means 6 (two sets have been shown in the figure) for a given cabin. Each mating means 6 has an active member 61 located on a side wall of the upper lid 5 and a receiving member 63 located on a side wall of a table 1. The active member 61 may be a protruding bar or stub or other forms desired. The receiving member 63 has a receiving notch 67 with an opening facing to the active member and two slant and smooth side walls to become guide slope 65 (also shown in FIG. 3A). The slant side walls meet at a bottom juncture or crutch to form an anchor spot 100 upon which the stub or bar of the active member may rest when the upper lid 5 is at a closed position laid on the table 1.

The guide slope 65 may be in the form of a V-shape, U-shape and the like.

Figure 3A:
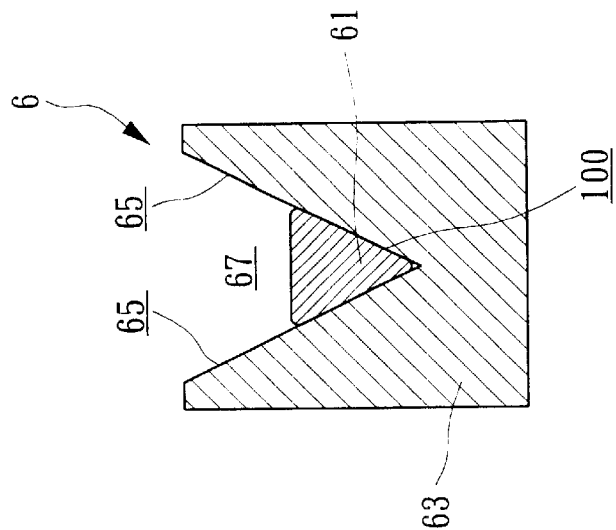
FIG. 3A is a fragmentary sectional view of a first embodiment of a mating mean of his invention.

FIG. 3A shows a first embodiment of the mating means 6 which has a V-shaped receiving notch 67 in the receiving member 63 and has a curved bottom recess to form the anchor spot 100. When the upper lid is closing, the active member 61 might be slightly deviated from the correct position (shown in broken circle) because of mechanical allowance happened to mechanical arm movement or other factors. However the guide slope 65 may automatically allows the stub or bar of the active member 61 to slip and slide downward until reaching the anchor spot 100 so that the upper lid 5 may make a precise and closed contact with the table 1.

Figure 3B:
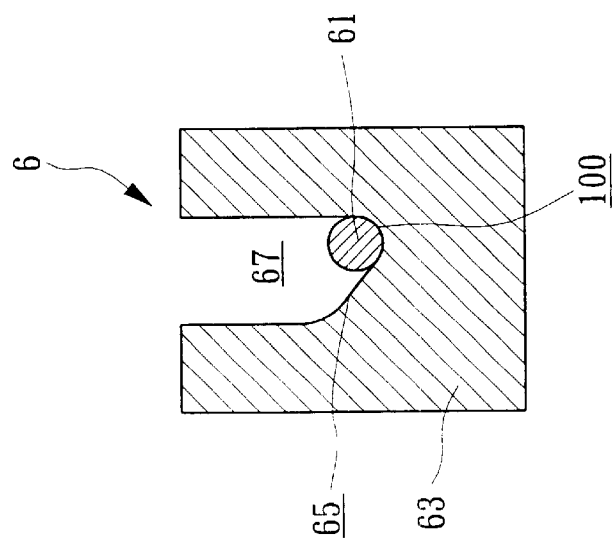
FIG. 3B is a fragmentary sectional view of a second embodiment of a mating means of this invention.

FIG. 3B shows a second embodiment of this invention. It is generally constructed like the one shown in FIG. 3A except that the receiving notch 67 is U-shaped, which has two substantially vertical side walls and one guide slope 65 skewed at a bottom leading to the anchor spot 100.

Figure 3C:
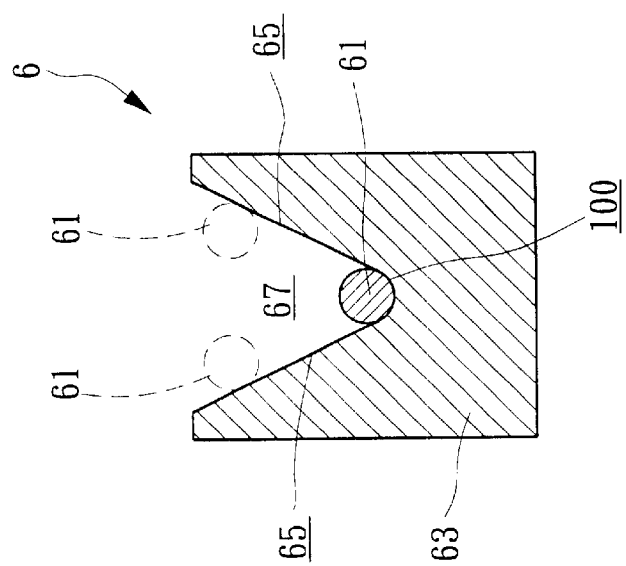
FIG. 3C is a fragmentary sectional view of a third embodiment of a mating means of this invention.

FIG. 3C shows a third embodiment of this invention which is largely constructed like the one shown in FIG. 3A. However the V-shaped receiving notch 67 has a crutch bottom to form the anchor spot 100. The active member 61 has a stub of a triangle cross section to mate against the receiving notch 67.

Figure 4:
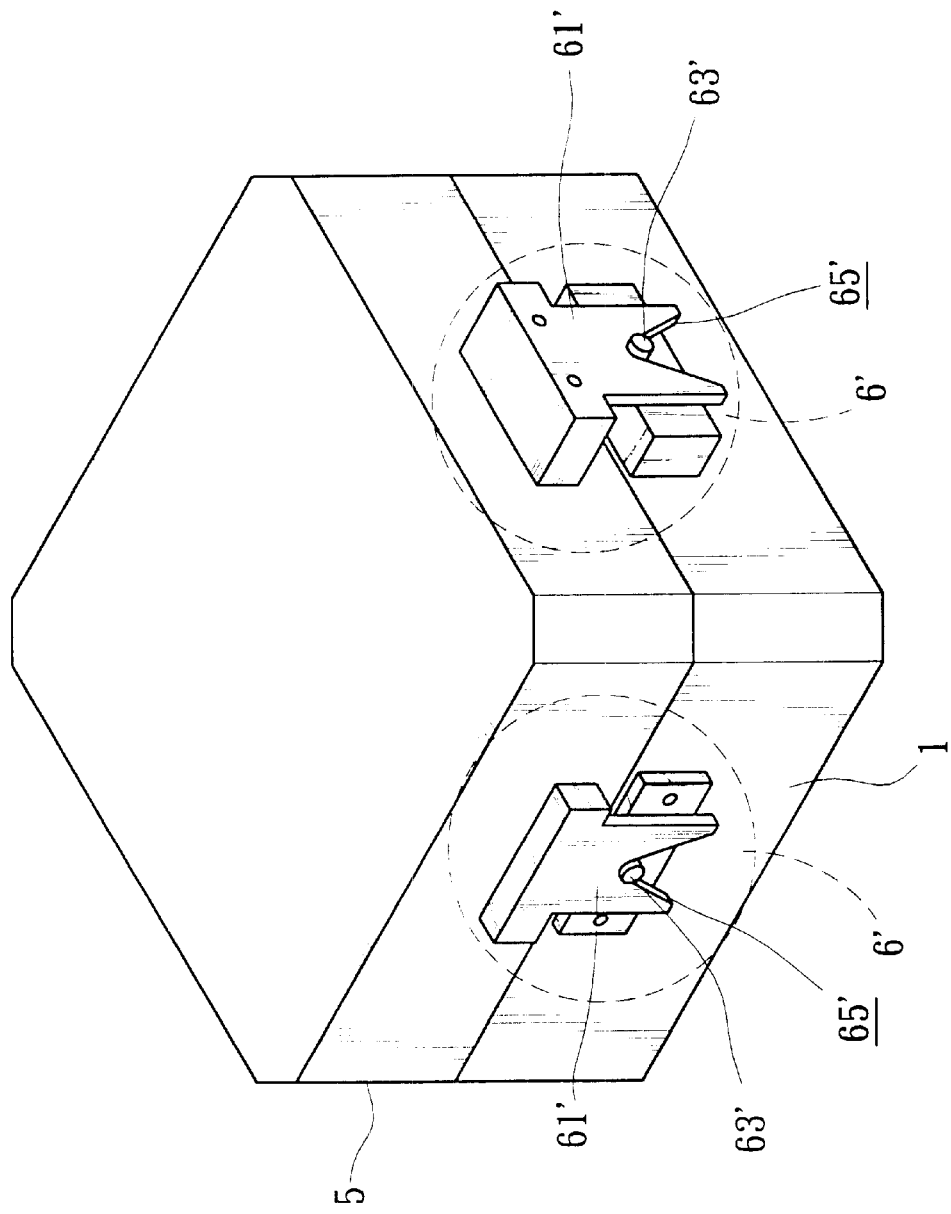
FIG. 4 is a perspective view of another embodiment of this invention.

FIG. 4 shows another embodiment of this invention. It is generally like the one shown in FIG. 2. However the mating means 6' has the active member 61' located on the table 1 and the receiving member 63' located on the upper lid 5. It may function equally well.

In order to make a desirable contact between the upper lid 5 and the table 1, the contact points between the two are preferably falling on a plane. As it takes at least three points to define or form a plane, it is preferably to include at least three sets of mating means of this invention on an upper lid for a cabin. To those cabins that already have one or two conventional alignment features located thereon, those features may be counted as complementary alignment means to this invention and be counted in the number of three sets.

It may thus be seen that the objects of the present invention set forth herein, as well as those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An upper lid alignment apparatus for hatchback reaction cabin, comprising:

at least three sets of mating means which employ a triangle geometric positional relationship to close an upper lid on a table, each mating means including an active member located on an outer wall of the upper lid and a receiving member located on the table, the receiving member having a guide slope for guiding the active member to an anchor spot located on the receiving member when the upper lid is closing upon the table.

2. The upper lid alignment apparatus of claim 1, wherein the active member is a protruding bar.

3. The upper lid alignment apparatus of claim 1, wherein the receiving member has a crutch opening facing the active member, the crutch opening has a slant side to form the guide slope and a bottom recess to form the anchor spot.

4. The upper lid alignment apparatus of claim 3, wherein the guide slope is V-shaped.

5. The upper lid alignment apparatus of claim 3, wherein the guide slope is U-shaped.

6. An upper lid alignment apparatus for hatchback reaction cabin, comprising:

at least three sets of mating means which employ a triangle geometric positional relationship to close an upper lid on a table, each mating means including an active member located on an outer wall of the upper lid and a receiving member located on the table, the active member having a guide slope for guiding the receiving member to an anchor spot located on the receiving member when the upper lid is closing upon the table.

7. The upper lid alignment apparatus of claim 6, wherein the receiving member is a protruding bar.

8. The upper lid alignment apparatus of claim 6, wherein the active member has a crutch opening facing the receiving member, the crutch opening has a slant side to form the guide slope and a bottom recess to form the anchor spot.

9. The upper lid alignment apparatus of claim 8, wherein the guide slope is V-shaped.

10. The upper lid alignment apparatus of claim 8, wherein the guide slope is U-shaped.

11. An upper lid alignment apparatus for hatchback reaction cabin, comprising:

at least three sets of mating means which employ a triangle geometric positional relationship to close an upper lid on a table, each mating means including an active member located on an outer wall of the upper lid and a receiving member located on the table, the receiving member having a U-shaped guide slope for guiding the active member to an anchor spot located on the receiving member when the upper lid is closing upon the table.

12. The upper lid alignment apparatus of claim 1, wherein the active member is a protruding bar.

13. The upper lid alignment apparatus of claim 1, wherein the receiving member has a crutch opening facing the active member, the crutch opening has a slant side to form the guide slope and a bottom recess to form the anchor spot.

* * * * *